(12) United States Patent
Yoon et al.

(10) Patent No.: US 11,757,046 B2
(45) Date of Patent: Sep. 12, 2023

(54) THIN FILM TRANSISTOR ARRAY SUBSTRATE FOR DIGITAL X-RAY DETECTOR DEVICE, DIGITAL X-RAY DETECTOR DEVICE, AND MANUFACTURING METHOD THEREOF

(71) Applicant: LG Display Co., Ltd., Seoul (KR)

(72) Inventors: Jaeho Yoon, Gyeongsangbuk-do (KR); Moonsoo Kang, Daegu (KR); Donghyeon Jang, Jinju-si (KR); Shihyung Park, Daegu (KR)

(73) Assignee: LG Display Co., Ltd., Seoul (KR)

( * ) Notice: Subject to any disclaimer, the term of this patent is extended or adjusted under 35 U.S.C. 154(b) by 277 days.

(21) Appl. No.: 17/100,328

(22) Filed: Nov. 20, 2020

(65) Prior Publication Data

US 2021/0175364 A1    Jun. 10, 2021

(30) Foreign Application Priority Data

Dec. 5, 2019    (KR) .......................... 10-2019-0160913

(51) Int. Cl.
| | |
|---|---|
| *G01T 1/36* | (2006.01) |
| *H01L 29/786* | (2006.01) |
| *H01L 29/22* | (2006.01) |
| *H01L 27/146* | (2006.01) |
| *H01L 29/66* | (2006.01) |

(52) U.S. Cl.
CPC .......... *H01L 29/78693* (2013.01); *G01T 1/36* (2013.01); *H01L 27/14658* (2013.01); *H01L 27/14689* (2013.01); *H01L 29/2206* (2013.01); *H01L 29/66742* (2013.01)

(58) Field of Classification Search
CPC .............................. G01T 1/2018; G01T 1/202
See application file for complete search history.

(56) References Cited

U.S. PATENT DOCUMENTS

| | | | | |
|---|---|---|---|---|
| 5,262,649 A | * | 11/1993 | Antonuk ............... | G01T 1/2018 250/370.11 |
| 6,272,018 B1 | * | 8/2001 | Feld .................... | G01R 31/2813 174/250 |
| 6,323,490 B1 | * | 11/2001 | Ikeda ................... | H04N 5/3658 250/370.07 |
| 6,459,132 B1 | * | 10/2002 | Mochizuki ........ | H01L 29/66742 257/443 |
| 6,480,577 B1 | * | 11/2002 | Izumi ................... | H01L 27/124 257/E27.111 |

(Continued)

FOREIGN PATENT DOCUMENTS

KR    10-135621 B1    1/2014

*Primary Examiner* — David P Porta
*Assistant Examiner* — Djura Malevic
(74) *Attorney, Agent, or Firm* — Fenwick & West LLP

(57) ABSTRACT

The present disclosure relates to a thin film transistor array substrate for a digital X-ray detector device and the digital X-ray detector device and a manufacturing method thereof. The thin film transistor array substrate comprises: a base substrate comprising a driving area and a non-driving area; at least one PIN diode disposed within the driving area of the base substrate and comprising a lower electrode, a PIN layer, and an upper electrode; and at least one align mark disposed within the non-driving area of the base substrate, wherein the align mark comprises a first align mark layer, an align PIN layer, and a second align mark layer.

12 Claims, 10 Drawing Sheets

(56) References Cited

U.S. PATENT DOCUMENTS

| | | | | |
|---|---|---|---|---|
| 6,531,346 B1* | 3/2003 | Kim | H01L 29/66765 | 438/164 |
| 6,617,584 B2* | 9/2003 | Choo | H01L 27/14683 | 257/E27.111 |
| 6,646,266 B2* | 11/2003 | Izumi | H01L 27/14618 | 250/370.08 |
| 6,774,399 B2* | 8/2004 | Hirata | H01L 27/1248 | 257/70 |
| 6,958,252 B2* | 10/2005 | Kim | H01L 27/1288 | 257/E27.111 |
| 6,969,896 B1* | 11/2005 | Partain | H01L 31/0224 | 257/E31.124 |
| 7,233,021 B2* | 6/2007 | Izumi | G02F 1/1339 | 257/E27.131 |
| 7,329,906 B2* | 2/2008 | Yamazaki | H01L 21/28158 | 257/E21.268 |
| 7,368,315 B2* | 5/2008 | Moon | H01L 27/14692 | 438/738 |
| 7,477,336 B2* | 1/2009 | Noda | H01L 27/1292 | 257/E27.111 |
| 7,541,595 B2* | 6/2009 | Yagi | G01T 1/24 | 250/362 |
| 7,728,511 B2* | 6/2010 | Shin | H01L 51/0021 | 313/504 |
| 7,834,948 B2* | 11/2010 | Takeda | H01L 27/1255 | 349/1 |
| 8,405,808 B2* | 3/2013 | Nakamura | G02F 1/136286 | 349/138 |
| 8,476,596 B2* | 7/2013 | Shin | H01L 27/14692 | 250/370.08 |
| 9,035,405 B2* | 5/2015 | Wu | H01L 27/14603 | 257/431 |
| 9,059,216 B2* | 6/2015 | Yamazaki | H01L 27/156 | |
| 9,269,740 B2* | 2/2016 | Kim | H01L 27/14658 | |
| 9,817,132 B2* | 11/2017 | Kim | H01L 27/14603 | |
| 10,054,694 B2* | 8/2018 | Yoon | H01L 27/14692 | |
| 10,121,804 B2* | 11/2018 | Ma | G02F 1/136204 | |
| 10,185,042 B2* | 1/2019 | Yoon | H01L 27/14687 | |
| 10,367,009 B2* | 7/2019 | Miyamoto | H01L 27/1262 | |
| 10,665,610 B2* | 5/2020 | Yamazaki | G02F 1/13458 | |
| 10,707,251 B2* | 7/2020 | Lee | G01T 1/2018 | |
| 10,768,317 B2* | 9/2020 | Tateishi | A61B 6/4233 | |
| 10,879,304 B2* | 12/2020 | Misaki | H01L 27/14692 | |
| 2002/0135039 A1* | 9/2002 | Yang | H01L 51/0005 | 257/499 |
| 2003/0079583 A1* | 5/2003 | Funakoshi | H01L 27/14676 | 83/13 |
| 2004/0041097 A1* | 3/2004 | Ishii | G01T 1/2928 | 250/370.07 |
| 2006/0237655 A1* | 10/2006 | Ishii | G01T 1/026 | 250/370.14 |
| 2006/0237656 A1* | 10/2006 | Ishii | G01T 1/2928 | 250/370.14 |
| 2007/0096647 A1* | 5/2007 | Choo | H01L 29/78669 | 257/E27.113 |
| 2007/0145285 A1* | 6/2007 | Ishii | H01L 27/14636 | 250/370.11 |
| 2008/0185529 A1* | 8/2008 | Alving | G01T 1/2928 | 250/370.09 |
| 2009/0001275 A1* | 1/2009 | Okada | H04N 5/32 | 250/370.08 |
| 2009/0065680 A1* | 3/2009 | Okada | H01L 27/14683 | 250/208.1 |
| 2009/0084938 A1* | 4/2009 | Okada | H01L 27/14658 | 250/208.1 |
| 2009/0146147 A1* | 6/2009 | Kim | H01L 27/14676 | 257/E21.085 |
| 2009/0152534 A1* | 6/2009 | Chabinyc | H01L 51/0024 | 438/69 |
| 2010/0001194 A1* | 1/2010 | Ishii | G01T 1/2018 | 250/370.08 |
| 2010/0007653 A1* | 1/2010 | Ahn | G09G 3/3677 | 345/98 |
| 2010/0054418 A1* | 3/2010 | Okada | G01T 1/2018 | 378/114 |
| 2010/0086198 A1* | 4/2010 | Tang | G06V 10/225 | 174/250 |
| 2010/0276604 A1* | 11/2010 | Okada | H01L 27/14676 | 250/370.09 |
| 2012/0018627 A1* | 1/2012 | Tredwell | H04N 5/357 | 378/207 |
| 2012/0161018 A1* | 6/2012 | Shin | H01L 27/14658 | 250/370.09 |
| 2012/0181439 A1* | 7/2012 | Cao | G01T 1/2018 | 250/366 |
| 2013/0207169 A1* | 8/2013 | Wu | H01L 27/14603 | 257/292 |
| 2013/0334431 A1* | 12/2013 | Ichimura | H01L 27/1462 | 257/59 |
| 2014/0027828 A1* | 1/2014 | Kim | H01L 27/14632 | 257/292 |
| 2014/0103347 A1* | 4/2014 | Ishino | H01L 27/14689 | 438/59 |
| 2014/0145198 A1* | 5/2014 | Kim | H01L 27/14658 | 257/67 |
| 2014/0145252 A1* | 5/2014 | Kim | H01L 27/14658 | 257/292 |
| 2015/0028338 A1* | 1/2015 | Iwata | H01L 27/14687 | 257/59 |
| 2015/0139398 A1* | 5/2015 | Tajima | G01T 1/026 | 378/62 |
| 2015/0204987 A1* | 7/2015 | Okada | A61B 6/4216 | 250/369 |
| 2017/0047449 A1* | 2/2017 | Takechi | H01L 27/1225 | |
| 2017/0192108 A1* | 7/2017 | Yoon | H01L 22/34 | |
| 2017/0192109 A1* | 7/2017 | Yoon | G01T 1/247 | |
| 2017/0192111 A1* | 7/2017 | Yoon | H01L 27/14658 | |
| 2017/0373111 A1* | 12/2017 | Tomyo | H04N 5/369 | |
| 2018/0166478 A1* | 6/2018 | Nakano | H01L 27/14663 | |
| 2019/0115385 A1* | 4/2019 | Moriwaki | H01L 27/14663 | |
| 2019/0123080 A1* | 4/2019 | Kanicki | H01L 27/14676 | |
| 2019/0165008 A1* | 5/2019 | Lee | H01L 31/022408 | |
| 2019/0196030 A1* | 6/2019 | Yang | G01N 23/04 | |
| 2019/0277982 A1* | 9/2019 | Tateishi | G03B 42/02 | |
| 2021/0175364 A1* | 6/2021 | Yoon | H01L 27/14658 | |
| 2021/0202779 A1* | 7/2021 | Hou | H04N 5/32 | |

* cited by examiner

THIN FILM TRANSISTOR ARRAY SUBSTRATE FOR DIGITAL X-RAY DETECTOR DEVICE, DIGITAL X-RAY DETECTOR DEVICE, AND MANUFACTURING METHOD THEREOF

CROSS-REFERENCE TO RELATED APPLICATION

This application claims priority to and the benefit of Republic of Korea Patent Application No. 10-2019-0160913, filed on Dec. 5, 2019, the disclosure of which is incorporated herein by reference in its entirety.

BACKGROUND

1. Field of the Disclosure

The present disclosure relates to a thin film transistor array substrate for a digital X-ray detector device and the digital X-ray detector device capable of reducing incorrect recognition of an align mark and a manufacturing method thereof.

2. Description of Related Art

Because X-ray is of a short wavelength, the X-ray may pass through an object easily. The transmittance of the X-ray depends on an inner density of the object. Therefore, an internal structure of the object may be observed by detecting an amount of the X-ray transmitted through the object.

One of X-ray based inspection methods used in a medical field is a film printing scheme. However, in the film printing scheme, in order to check a result, an image is shot, and then a film is printed. Thus, it takes a long time to check the result. Especially, in the film printing scheme, there are some difficulties in storing and preserving the printed film.

A digital X-ray detector (DXD) device using a thin film transistor has been developed and widely used in the medical field.

The DXD device detects the transmittance of the X-ray transmitted through the object and displays an internal state of the object on a display based on the transmittance.

Therefore, the digital X-ray detector device may display the internal structure of the object without using an additional film and printed paper. Further, the DXD device may check the results in real time immediately after X-ray photographing.

SUMMARY

Components such as a driving thin film transistor or a PIN diode of a digital X-ray detector device may be formed by repeatedly depositing and patterning a plurality of layers using multiple masks.

In this case, the mask is aligned using one or more align marks to minimize misalignment of each of layers sequentially stacked.

The align marks are recognized using apparatuses such as microscopes or cameras to determine and adjust the alignment of the mask, thereby accurately forming the layers according to an intended design.

The digital X-ray detector device detects current inside a digital X-ray detection panel to implement an image based on the current and uses a photo PIN (P type semiconductor-Intrinsic type semiconductor-N type semiconductor) diode that responds to light.

A PIN diode includes a PIN layer, which is a high-deposition film having a thickness of him or more and the PIN layer is formed using a dry etching gas.

In this case, the PIN layer may not be completely etched due to a thick thickness of the PIN layer at an area where the PIN layer may be completely etched and a PIN remaining film may remain as an etching residue of the PIN layer.

If the PIN remaining film covers at least a portion of the align mark, incorrect recognition of the align mark may occur, thereby reducing process accuracy after the PIN layer is formed and blocking proper inspection of the digital X-ray detector panel.

Accordingly, the inventors of the present disclosure invented a thin film transistor array substrate for a digital X-ray detector device and the digital X-ray detector device capable of reducing the incorrect recognition of the align mark and a manufacturing method thereof.

The present disclosure provides a thin film transistor array substrate for a digital X-ray substrate and the digital X-ray detector device capable of reducing formation of a PIN remaining film in an align mark and a manufacturing method thereof.

The present disclosure also provides a thin film transistor array substrate for a digital X-ray substrate and the digital X-ray detector device capable of reducing the incorrect recognition of the align mark after the PIN layer is formed and a manufacturing method thereof.

The objects of the present disclosure are not limited to the above-mentioned objects, and the other objects and advantages of the present disclosure, which are not mentioned, may be understood by the following description, and more clearly understood by the embodiments of the present disclosure. It is also readily understood that the objects and the advantages of the present disclosure may be implemented by features described in appended claims and a combination thereof.

According to an embodiment of the present disclosure, there are provided a thin film transistor array substrate for a digital X-ray detector device and the digital X-ray detector device capable of reducing formation of the PIN remaining film in the align mark and the incorrect recognition of the align mark after the PIN layer is formed and a manufacturing method thereof.

According to an embodiment of the present disclosure, a thin film transistor array substrate for a digital X-ray detector device and the digital X-ray detector device includes a base substrate including a driving area and a non-driving area, at least one PIN diode disposed within the driving area of the base substrate and including a lower electrode, a PIN layer, and an upper electrode, and at least one align mark disposed within the non-driving area of the base substrate and the align mark includes a first align mark layer, an align PIN layer, and a second align mark layer.

In this case, the first align mark layer, the align PIN layer, and the second align mark layer may be sequentially stacked on the base substrate.

A driving thin film transistor is disposed in the driving area of the base substrate, is connected to the PIN diode, and includes an active layer, a first electrode, a second electrode, and a gate electrode and the first align mark layer may be made of the same material as the gate electrode.

In addition, the PIN layer may be made of the same material as the align PIN layer, a bias electrode may be disposed on the PIN layer, and the second align mark layer may be made of the same material as the bias electrode.

In addition, according to an embodiment of the present disclosure, a method for manufacturing a thin film transistor array substrate for a digital X-ray detector device includes i) forming a driving thin film transistor in at least one pixel within a driving area of a base substrate, the driving thin film transistor including an active layer, a first electrode, a second electrode, and a gate electrode and forming a first align mark layer in at least one align mark within a non-driving area, ii) forming a lower electrode on the driving thin film transistor, iii) forming a PIN film above a whole surface of the base substrate and forming an upper electrode film on the PIN layer, iv) forming a photo resist on the upper electrode film to correspond to each of the align mark and the pixel, v) forming an align PIN layer and an align upper electrode layer in the align mark and forming a PIN diode including the lower electrode, the PIN layer, and an upper electrode in the pixel by patterning the upper electrode film and the PIN film, and vi) forming a second align mark layer above the align upper electrode layer and forming a bias electrode above the upper electrode.

In this case, the gate electrode and the first align mark layer may be formed by the same patterning process, the PIN layer and the align PIN layer may be formed by the same patterning process, and the bias electrode and the second align mark layer may be formed by the same patterning process.

According to the present disclosure, an align PIN layer is formed above the first align mark layer through the same patterning process as the patterning process using a photo resist for forming the PIN layer in the pixel. Accordingly, the formation of the unintended PIN remaining film may be reduced through the patterning process in the align mark.

Further, according to the present disclosure, the align PIN layer is formed on the first align mark layer and the second align mark layer is further formed and the second align mark layer may be used as an align mark after the PIN layer is formed to reduce the incorrect recognition of the align mark after the PIN layer is formed.

Specific effects of the present disclosure, in addition to the above-mentioned effects, will be described together while describing specific matters to implement the present disclosure.

DETAILED DESCRIPTION

Figure 1:
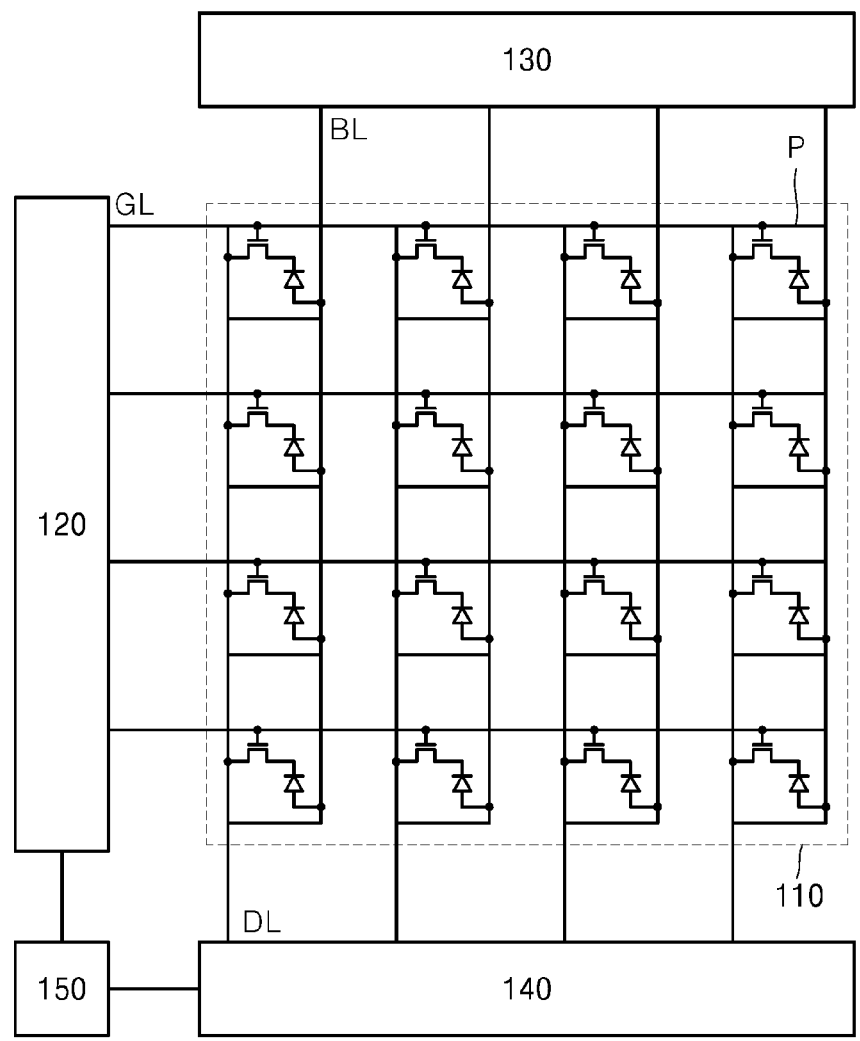
FIG. 1 is a schematic block diagram showing a digital X-ray detector device according to one embodiment.

Some embodiments of the present disclosure are described in detail with reference to the accompanying drawings. Accordingly, the skilled person in the art to which the present disclosure pertains may easily implement the technical idea of the present disclosure. In the description of the present disclosure, if it is determined that a detailed description of a well-known technology relating to the present disclosure may be omitted if it unnecessarily obscures the gist of the present disclosure. One or more embodiments of the present disclosure are described in detail with reference to the accompanying drawings. In the drawings, same reference numerals may be used to refer to same or similar components.

In this document, the terms "upper," "lower," "on," "under," or the like are used such that, where a first component is arranged at "an upper portion" or "a lower portion" of a second component, the first component may be arranged in contact with the upper surface (or the lower surface) of the second component, or another component may be disposed between the first component and the second component. Similarly, where a first component is arranged on or under a second component, the first component may be arranged directly on or under (in contact with) the second component, or one or more other components may be disposed between the first component and the second component.

Further, the terms "connected," "coupled," or the like are used such that, where a first component is connected or coupled to a second component, the first component may be directly connected or able to be connected to the second component, or one or more additional components may be disposed between the first and second components, or the first and second components may be connected or coupled through one or more additional components.

Hereinafter, a thin film transistor array substrate for a digital X-ray detector device, the digital X-ray detector device, and a manufacturing method thereof according to some embodiment of the present disclosure are described.

FIG. 1 is a schematic block diagram showing a digital X-ray detector device. The digital X-ray detector device may include a thin film transistor array 110, a gate driver 120, a bias supply 130, a readout circuitry 140, and a timing controller 150.

The thin film transistor array 110 may include a plurality of cell regions defined by a plurality of gate lines GL arranged in a first direction and by a plurality of data lines DL arranged in a second direction orthogonal to the first direction.

The cell regions are arranged in a matrix configuration. Each cell region may include a pixel region in which photo-sensitive pixels Ps are formed. The thin film transistor array 110 may detect the X-ray emitted from an X-ray source, may convert the detected X-ray into an electrical signal, and may output the electrical signal.

Each photo-sensitive pixel may include a PIN (P type semiconductor-intrinsic type semiconductor-N type semiconductor) diode which converts light of a visible light region converted from the X-ray by a scintillator into an electronic signal and outputs the electronic signal and a thin film transistor TFT that transmits a detected signal output from the PIN diode to a readout circuitry 140. A first end of the PIN diode may be connected to the thin film transistor and a second end thereof may be connected to a bias line BL.

A gate electrode of the thin film transistor may be connected to the gate line GL which carries a scan signal. Source/drain electrodes of the thin film transistor may be respectively connected to the PIN diode and a data line DL which carries the detected signal output from the PIN diode. Each bias line BL may extend in a parallel manner to each data line DL.

The gate driver 120 may sequentially apply gate signals to thin film transistors of photo-sensitive pixels through the gate lines GLs. The thin film transistors of the photo-sensitive pixels may be turned on in response to the gate signals having a gate-on voltage level.

The bias supply 130 may apply driving voltages to the photo-sensitive pixels through the bias lines BL. The bias supply 130 may selectively apply a reverse bias or a forward bias to the PIN diode.

The readout circuitry 140 may read out the detected signal received from the thin film transistor turned on in response to the gate signal of the gate driver. For example, the detected signal output from the PIN diode may be input to the readout circuitry 140 through the thin film transistor and the data line DL.

The readout circuitry 140 may have an offset readout period for which an offset image is read out and an X-ray readout period for which the detected signal after an X-ray exposure is read out and may read out the detection signal output from the photo-sensitive pixels during the X-ray readout period.

The readout circuitry 140 may include a signal detector and a multiplexer. The signal detector includes a plurality of amplification circuits that correspond respectively to the data lines DL. Each amplification circuit may include an amplifier, a capacitor, and a reset element.

The timing controller 150 may control an operation of the gate driver 120 by generating a start signal and a clock signal and supplying each of the start signal and the clock signal to the gate driver 120. Further, the timing controller 150 may control an operation of the readout circuitry 140 by generating a readout control signal and a readout clock signal and supplying each of the readout control signal and the readout clock signal to the readout circuitry 140.

Figure 2:
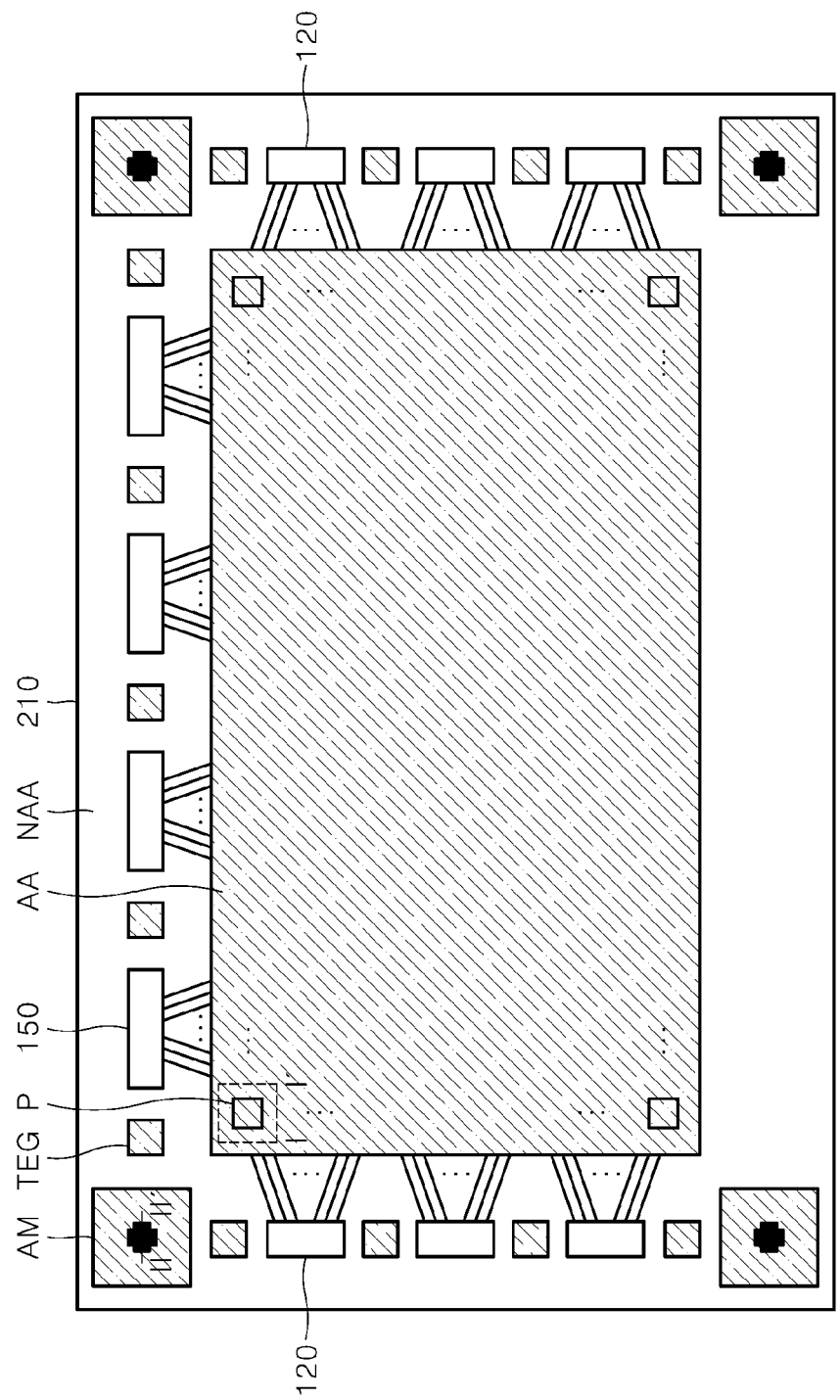
FIG. 2 is a schematic plan view showing an example digital X-ray detector device according to one embodiment.

Hereinafter, a digital X-ray detector device according to one embodiment of the present disclosure is described in detail with reference to FIG. 2.

According to one embodiment of the present disclosure, a thin film transistor array substrate for a digital X-ray detector device and the digital X-ray detector device include a base substrate including a driving area AA and a non-driving area NAA.

The driving area AA includes a plurality of pixels P and each pixel P includes a photo-sensitive pixel with a driving thin film transistor and a PIN diode.

The non-driving area NAA surrounds the driving area AA.

At least one readout circuitry 140 may be disposed at one side of the non-driving area NAA, for example, above the driving area AA. For example, a readout integrated circuit (ROIC) pad may be disposed.

In addition, a gate driver 120 may be disposed at one or more other sides of the non-driving area NAA in which the readout circuitry 140 is not disposed. For example, the gate driver 120 may be disposed at the left side or the right side, or the left side and the right side of the driving area.

In this case, the gate driver 120 may be arranged using a gate in panel (GAP) method.

An align mark AM may be disposed at each of a plurality of corners of the non-driving area NAA, and in one embodiment, for the accuracy of align mark recognition and align mark adjustment, the align marks AM may be disposed at four corners of the non-driving area NAA.

In addition, at least one test element group TEG pattern may be disposed in the non-driving area NAA and characteristics of an element in the driving area may be determined based on the TEG pattern. Therefore, the TEG pattern may have the same pattern as each of the elements in the pixel of the driving area.

For example, the TEG pattern may be formed in the same pattern as the photo-sensitive pixel in the pixel. Accordingly, the TEG pattern may include a pattern of each of a driving thin film transistor and a PIN diode.

Figure 3:
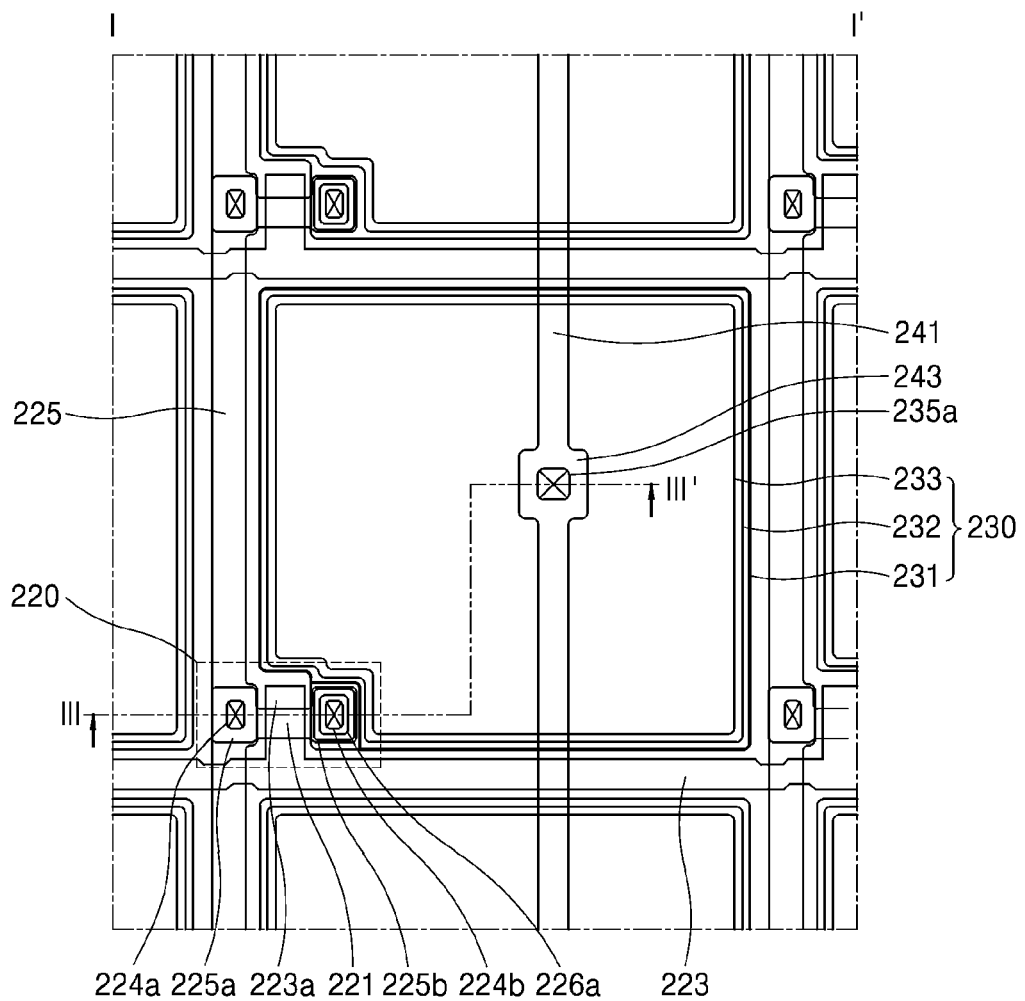
FIG. 3 is a plan view showing an example area taken along line I-I' of a digital X-ray detector device according to one embodiment.
Figure 4:
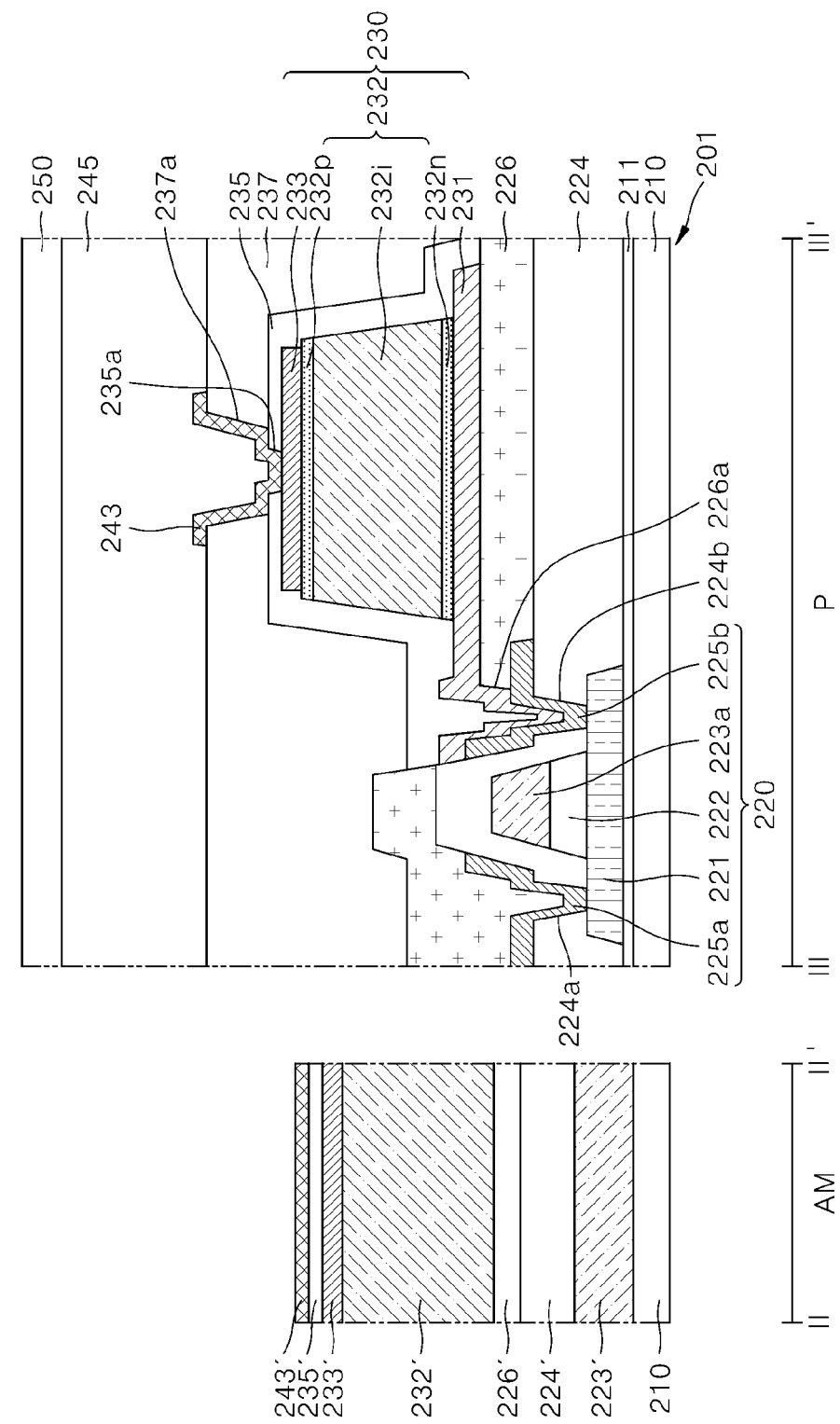
FIG. 4 is a cross-sectional view showing an example area taken along line II-II' and III III' of a digital X-ray detector device according to one embodiment.

A pixel and an align mark of a digital X-ray detector device according to an embodiment of the present disclosure are described below in detail with reference to FIGS. 3 and 4.

According to an embodiment of the present disclosure, a digital X-ray detector 200 includes a base substrate 210.

A base substrate 210 may be embodied as a glass substrate made of glass, but is not limited thereto. In some cases where the base substrate 210 is used for a flexible digital X-ray detector device, a substrate made of polyimide material and having flexible properties may be used as an example of the base substrate 210.

On the base substrate 210, a plurality of pixels are defined by a plurality of gate lines 223 and a plurality of data lines 225 intersecting with each other in an orthogonal manner.

Each pixel includes the thin film transistor 220 and the PIN diode 230. The plurality of thin film transistors 220 and the plurality of PIN diodes 230 may be disposed on an array substrate having the plurality of pixels. The thin film transistor 220 and the PIN diode 230 of the pixel are described below and this configuration may also be applied to adjacent pixels unless otherwise specified.

A thin film transistor 220 including a first electrode 225a, a second electrode 225b, a gate electrode 223a, and an active layer 221 is disposed in a driving area of the base substrate 210.

A buffer layer 211 may be disposed between the base substrate 210 and the thin film transistor 220. In this case, the buffer layer 211 may be made of an inorganic material such as silicon oxide (SiOx) or silicon nitride (SiNx) and may be provided as a multi-buffer layer composed of multiple sub-layers.

The active layer 221 is disposed above the base substrate 210. The active layer 221 may be made of an oxide semiconductor material such as indium gallium zinc oxide (IGZO), but is not limited thereto, and may be made of low temperature polycrystalline silicon (LTPS) or amorphous silicon (a-Si).

The active layer 221 may include, for example, a channel region and conducting regions, where the channel region is disposed between two conducting regions. In some examples, the conducting regions may be divided into a first conducting region connected in direct contact with a first electrode 225a and a second conducting region connected in direct contact with a second electrode 225b.

The conducting regions of the active layer 221 may be formed by conducting both ends of the active layer 221 and various types of methods such as a dry etching method, a hydrogen plasma treatment, a helium plasma treatment, and the like may be used as examples of a conducting treatment method.

A gate electrode 223a is disposed above the active layer 221 and a gate insulating layer 222 is disposed between the active layer 221 and the gate electrode 223a to insulate the active layer 221 from the gate electrode 223a.

For example, the gate electrode 223a may be disposed on the gate insulating layer 222 to correspond to the channel region of the active layer 221. The gate electrode 223a may be made of, but is not limited to, one selected from a group consisting of molybdenum (Mo), aluminum (Al), chromium (Cr), gold (Au), titanium (Ti), nickel (Ni), copper (Cu) and alloys thereof and may include a single layer or a multiple layers.

The gate electrode 223a may extend from a gate line 223. The gate line 223 and the gate electrode 223a may be integrated with each other such that the gate electrode 223a is disposed in the gate line 223. Accordingly, the gate line 223 and the gate electrode 223a may be disposed on the same layer.

The gate insulating layer 222 made of an inorganic material is disposed under the gate electrode 223a and may have the same or greater area than that of the gate electrode 223a for effective insulation.

The gate electrode 223a and the gate insulating layer 222 may each be disposed at a central region of the active layer 221. In this example, a first area of the active layer 221 exposed without being overlaid by the gate electrode 223a, for example, a first end of the active layer 221 other than the channel area may be a first conducting region and a second area of the active layer 221 exposed by not being overlaid by the gate electrode 223a, for example, a second end of the active layer 221 other than the channel area may be a second conducting region.

In this case, the first conducting region may be a drain region and the second conducting region may be a source region.

The source region of the active layer 221 may be disposed closer to the PIN diode 230 than the drain region, but is not limited thereto, and the positions of the source region and the drain region may be interchanged.

An interlayer insulating layer 224 made of an inorganic material may be disposed on the gate electrode 223a to overlay the base substrate 210. The first electrode 225a and the second electrode 225b may each be disposed on the interlayer insulting layer 224.

The first electrode 225a may be disposed at a first side of the active layer 221 and the second electrode 225b may be disposed at the second side of the active layer 221. Accordingly, the gate electrode 223a may be disposed between the first electrode 225a and the second electrode 225b. A first contact hole 224a may be provided in the interlayer insulating layer 224 at an area in which the active layer 221 overlaps with the first electrode 225a and a second contact hole 224b may be provided in the interlayer insulating layer 224 at an area in which the active layer 221 overlaps with the second electrode 225b.

In some examples, the first contact hole 224a may be provided on the drain region of the active layer 221 and the second contact hole 224b may be provided on the source region. Accordingly, the first electrode 225a is connected to the drain region of the active layer 221 through the first contact hole 224a and the second electrode 225b may be connected to the source region of the active layer 221 through the second contact hole 224b.

Accordingly, the first electrode 225a connected to the drain region may be a drain electrode and the second electrode 225b connected to the source region may be a source electrode.

The first electrode 225a and the second electrode 225b may each extend from the data line 225 and may each be disposed on the same layer as the data line 225.

The data line 225 may be made of, but is not limited to, one selected from a group consisting of molybdenum (Mo), aluminum (Al), chromium (Cr), gold (Au), titanium (Ti), nickel (Ni), copper (Cu) and alloys thereof.

A first passivation layer 226 may be disposed on or above the thin film transistor 220 to overlay a whole surface of the base substrate. The first passivation layer 226 may made of an inorganic material such as silicon oxide (SiOx) or silicon nitride (SiNx), but is not limited thereto. The first passivation layer 226 may protect the lower thin film transistor 220, for example, the active layer 221.

The PIN diode 230 is disposed on the first passivation layer 226 to be connected to the lower thin film transistor 220. The PIN diode 230 may be disposed in the pixel region.

The PIN diode 230 may include a lower electrode 231 connected to the thin film transistor 220, a PIN layer 232 on the lower electrode 231, and an upper electrode 233 on the PIN layer 232.

The lower electrode 231 may function as a pixel electrode in the PIN diode 230. The lower electrode 231 may be made of an opaque metal such as molybdenum Mo or at least one of transparent oxides such as indium tin oxide (ITO), indium zinc oxide (IZO), and zinc oxide (ZnO), depending on characteristics of the PIN diode 230.

The lower electrode 231 may be connected to the second electrode 225b of the thin film transistor 220 via a third contact hole 226b as a contact hole in the first passivation layer 226. Therefore, the thin film transistor 220 may be connected to the PIN diode 230.

The PIN layer 232 may be disposed on the lower electrode 231 to convert a visible light, which has been converted from the X-ray, into an electrical signal. In this connection, a scintillator may convert the X-ray into the visible light.

The PIN layer 232 may be formed by sequentially stacking, on the lower electrode 231, an N (Negative) type semiconductor layer 232n containing N type impurities, an I (Intrinsic) type semiconductor layer 232i, and a P (Positive) type semiconductor layer 232p containing P type impurities.

The I-type semiconductor layer may be relatively thicker than each of the N-type semiconductor layer and the P-type semiconductor layer. The PIN layer 232 may be made of a material capable of converting the visible light into which the X-ray emitted from an X-ray source is converted into an electrical signal, for example, a-Se, $HgI_2$, CdTe, PbO, $PbI_2$, $BiI_3$, GaAs, and Ge.

The upper electrode 233 may be disposed on the PIN layer 232. The upper electrode 233 may be made of at least one of transparent oxides such as indium tin oxide (ITO), indium zinc oxide (IZO), and zinc oxide (ZnO) and may improve a fill factor of the PIN diode 230.

A second passivation layer 235 may be disposed above the PIN diode 230. The second passivation layer 235 may be made of an inorganic material such as silicon oxide (SiOx) or silicon nitride (SiNx), but is not limited thereto. The second passivation layer 235 may cover up to a side surface of the PIN diode 230 to protect the side surface of the PIN diode 230 from moisture or other foreign substances.

A bias electrode 243 may be disposed on the second passivation layer 235 on the PIN diode 230. The bias electrode 243 may be connected to the upper electrode 233 of the PIN diode 230 via a fourth contact hole 235a as a contact hole in the second passivation layer 235 and may apply a bias voltage to the PIN diode 230.

The bias electrode 243 may be branched from a bias line 241 arranged in parallel to the data line 225.

In this case, a first planarization layer 237 is disposed between the second passivation layer 235 and the bias electrode 243 to overlay a whole surface of the base substrate 210 including the PIN diode 230.

The first planarization layer 237 may be made of an organic material such as PAC (Photo Acryl), but is not limited thereto.

In this case, a fifth contact hole 237a may be provided in the first planarization layer 237 to expose the upper electrode 233 to a position of the second passivation layer 235 corresponding to a fourth contact hole 235a. The bias electrode 243 may be electrically connected to the upper electrode 233 through the fourth contact hole 235a and the fifth contact hole 237a.

The second planarization layer 245 may be disposed on the bias electrode 243 to overlay the whole surface of the base substrate 210.

The second planarization layer 245 may be made of an organic material such as PAC (Photo Acryl), but is not limited thereto.

A scintillator layer 250 may be disposed on the second planarization layer 245 to overlay the PIN diode 230 above the base substrate.

In some examples, the scintillator layer 250 is disposed above each of the thin film transistor 220 and the PIN diode 230 to overlay each of the thin film transistor 220 and the PIN diode 230.

As the scintillator layer 250 may be directly deposited on the array substrate 201, the planarization of a lower surface of the scintillator layer 250 may be needed. Therefore, the second planarization layer 245 is formed to planarize the lower surface of the scintillator layer 250 to facilitate the formation of the scintillator layer 250 by deposition of the scintillator.

The scintillator layer 250 may be grown in a vertical direction to have a plurality of columnar crystal phases, such that a plurality of scintillator columnar crystals may be arranged in a side-by-side manner, but is not limited thereto. The scintillator may be made of a material such as cesium iodide (CsI), but is not limited thereto.

In some examples, at least one align mark AM is disposed in the non-driving area NAA of the base substrate 210 and the align mark AM includes a first align mark layer 223', an align PIN layer 232', and a second align mark layer 243'.

In this case, the first align mark layer 223', the align PIN layer 232', and the second align mark layer 243' are sequentially stacked on the base substrate 210.

In the case of the align mark AM, various layers rather than the first align mark layer 223', the align PIN layer 232', and the second align mark layer 243' may be each further formed among the layers according to a process and this configuration is described below in detail.

The first align mark layer 223' is disposed on the base substrate 210.

The first align mark layer 223' is a layer in which the align mark is recognized by an align mark recognition device and may have a cross-shaped pattern, but is not limited thereto.

The first align mark layer 223' may be made of the same material as the gate electrode 223a of the driving area AA and may be formed through the same patterning process as the gate electrode 223a of the driving area AA.

As the first align mark layer 223' is formed by the same patterning process as the gate electrode 223a, processes subsequent to a mask process for forming the gate electrode 223a may be accurately performed by reducing a deviation by the first align mark layer 223'.

An align interlayer insulating layer 224' may be disposed on the first align mark layer 223' and the first align passivation layer 226' may be disposed above the first align mark layer 223'.

The align interlayer insulating layer 224' may be made of the same material as the interlayer insulating layer 224 of the driving area AA and may be formed by the same patterning process as the interlayer insulating layer 224 of the driving area AA. The first align passivation layer 226' may be made of the same material as the first passivation layer 226 of the driving area AA and may be formed by the same patterning process as the first passivation layer 226 of the driving area AA.

The align interlayer insulating layer 224' and the first align passivation layer 226' may each be made of a transparent inorganic material not to prevent the recognition of the first align mark layer 223', even if the align interlayer insulating layer 224' and the first align passivation layer 226' may each be disposed on or above the first align mark layer 223'.

An align PIN layer 232' may be disposed on the first align passivation layer 226'.

The align PIN layer 232' may be made of the same material as the PIN layer 232 in the driving area AA and may be formed by the same patterning process as the PIN layer 232 in the driving area AA.

Accordingly, an incomplete PIN remaining film is not disposed in the align mark AM, but a complete align PIN layer 232' may be disposed in the align mark AM. Specifically, the align PIN layer 232' may have the same stacking structure and may be made of the same material as the PIN layer 232 including the n-type semiconductor layer 232n, the intrinsic semiconductor layer 232i, and p type semiconductor layer 232p, in the driving area AA.

The align PIN layer 232' is physically spaced apart from the PIN layer 232 in the driving area AA and has an island shape such that the align PIN layer 232' is not electrically connected to the PIN layer 232 in the driving area AA.

The align upper electrode layer 233' may be disposed on the align PIN layer 232'.

The align upper electrode layer 233' may be made of the same material as the upper electrode 233 in the driving area AA and may be formed by the same patterning process as the upper electrode 233 in the driving area AA.

The align upper electrode layer 233' is also physically spaced apart from the upper electrode 233 in the driving area AA and has an island shape such that the align upper electrode layer 233' is not electrically connected to the upper electrode 233 in the driving area AA.

A second align passivation layer 235' may be disposed on the align upper electrode layer 233'. The second align passivation layer 235' may be made of the same material as the second passivation layer 235 in the driving area AA and formed by the same patterning process as the second passivation layer 235 in the driving area AA.

A second align mark layer 243' may be disposed on the second align passivation layer 235'.

The second align mark layer 243', similar to the first align mark layer 223', is a layer in which the align mark is recognized by the align mark recognition device and may have a cross-shaped pattern, but is not limited thereto.

The second align mark layer 243' may be made of the same material as the bias electrode 243 of the driving area AA and may be formed by the same patterning process as the bias electrode 243 of the driving area AA.

As the second align mark layer 243' is made of the same material as the bias electrode 243 and is formed by the same patterning process as the bias electrode 243, processes subsequent to a mask process for forming the bias electrode 243 may be accurately performed by reducing a deviation by the second align mark layer 243'.

In particular, according to the present disclosure, even if the first align mark layer 223' is not recognized by the align PIN layer 232' disposed above the first align mark layer 223', the align mark may be clearly recognized by the second align mark layer 243' formed above the align PIN layer 232'. Therefore, a process subsequent to the second align mark layer 243' forming process may be accurately performed by minimizing the deviation by the second align mark layer 243'.

For example, the second align mark layer 243' may function as an align mark in a layer forming process subsequent to a bias electrode 243 forming process and additional processes such as attachment of an upper substrate to the base substrate 210, after the PIN layer 232 forming process.

According to an embodiment of the present disclosure, there is provided a thin film transistor array substrate for a digital X-ray detector device and the digital X-ray detector device capable of reducing the formation of the PIN remaining film in the align mark and reducing incorrect recognition of the align mark after the PIN layer forming process.

The digital X-ray detector 200 according to the present disclosure operates as follows.

An X-ray is irradiated to the digital X-ray detector 200. The scintillator layer 250 converts the X-ray into the visible light. The PIN layer 232 of the PIN diode 230 converts the light in the visible region into an electronic signal.

For example, when the light in the visible region is irradiated to the PIN layer 232, the I-type semiconductor layer is depleted by each of the N-type semiconductor layer and the P-type semiconductor layer, thereby generating an electric field therein. Then, holes and electrons generated by the light drift based on the electric field and are collected into the P-type semiconductor layer and the N-type semiconductor layer, respectively.

The PIN diode 230 converts the light in the visible region into the electronic signal and transmits the electronic signal to the thin film transistor 220. The electronic signal thus transmitted is displayed as an image signal via the data line 225 connected to the thin film transistor 220.

Effects of the present disclosure, through which the formation of the PIN remaining film may be minimized, as well as the reason for the formation of the PIN remaining film, are described below in more detail.

The PIN diode of the digital X-ray detector device includes a single film having a greater thickness than that of each of other elements of other display devices. For example, the PIN diode of the digital X-ray detector device is formed by depositing the PIN layer including the single film having the thick thickness of 1 μm or more.

The patterning process is performed using a mask such as a photo resist PR after the PIN layer is deposited. The remaining area of the PIN layer except for a patterning area PTA which is patterned by the patterning process is removed through dry etching.

In this case, the patterning area PTA may refer to an area where a mask is disposed and may refer to a remaining area not etched during an etching process such as the dry etching.

In some examples, a non-patterning area NPTA may refer to an area where no mask is disposed and may refer to an area that is etched to be removed during an etching process such as dry etching.

An etching substrate is inserted into a dry etching chamber to perform the dry etching process.

Figure 5A:
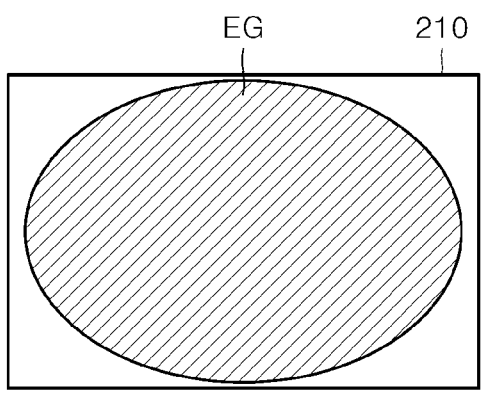
FIGS. 5A-5C show a main active area of dry etching gas and a vulnerable area of dry etching gas formed above a base substrate according to one embodiment.
Figure 5B:
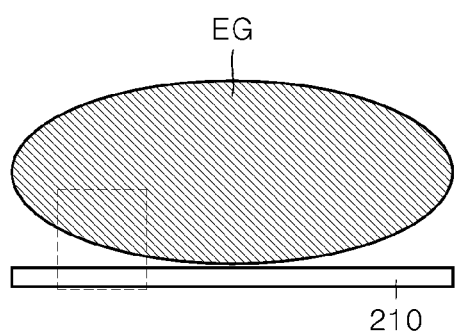

In this case, if a voltage is applied to each of an upper portion and a lower portion of the chamber after dry etching gas EG is injected into the chamber, dry etching gas EG in a plasma state is not evenly distributed over a whole surface of the substrate, but has an elliptical distribution as shown in FIGS. 5A and 5B.

In this example, in a plan view of the substrate as shown in FIGS. 5A and 5B, a main active area of the etching gas may have an elliptical shape with respect to a center of the substrate. A region rather than the main active area may be a vulnerable area of the etching gas.

For example, four corners which are edge areas of the substrate as shown in FIG. 5A and an outer rim area of the substrate below the main active area of the etching gas as shown in FIG. 5B may each be a vulnerable area of the etching gas and the vulnerable area of the etching gas has a low distribution density compared to that of the center region of the etching gas.

Therefore, an edge of the chamber, for example, an edge of the substrate with respect to the center of the substrate may be a vulnerable area of the etching gas with less influence of the etching gas.

Figure 5C:
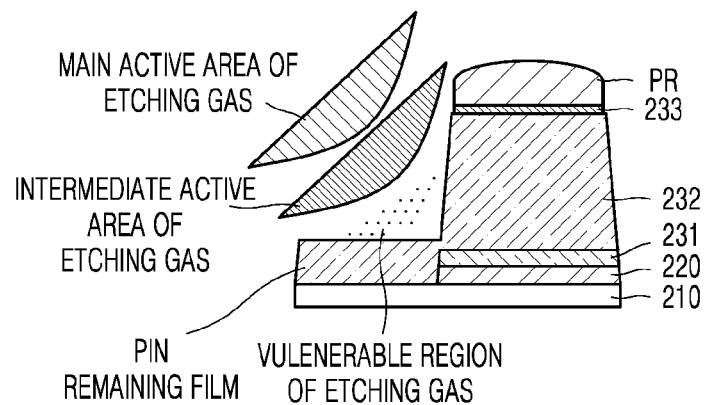

FIG. 5C shows an activation degree of etching gas according to patterning in detail for each region.

As shown in FIG. 5C, a driving thin film transistor 220, a lower electrode 231, a PIN layer 232, and an upper electrode 233 are stacked on the patterning area PTA of a base substrate 210. To this end, the PIN film 232" in the non-patterning area NPTA, not in the patterning area PTA is etched with the dry etching gas EG using the mask.

In the case of the dry etching gas EG having an elliptical density distribution, the density of the etching gas is relatively reduced toward a bottom and the density of the etching gas in an intermediate active area of the etching gas is reduced than the density of the etching gas in a main active area of the etching gas and the density of the etching gas in the vulnerable area of the etching gas is reduced than the density of the etching gas in the intermediate active area of the etching gas.

Therefore, when the PIN film 232" is etched, the etching may be properly performed in the main active area of the etching gas, but the etching is not properly performed in each of the intermediate active area of the etching gas and the vulnerable area of the etching gas to block the PIN film 232" in the non-patterning region NPTA from being completely removed and to remain as the PIN remaining film.

For example, a large amount of PIN film 232" in the vulnerable area of the etching gas in which the etching performance is degraded in the non-patterning region NPTA may be removed more than the patterning region PTA to completely etch and remove the PIN film 232". However, the PIN film 232" may not be completely removed due to the low density of the etching gas to remain the PIN remaining film.

Figure 6:
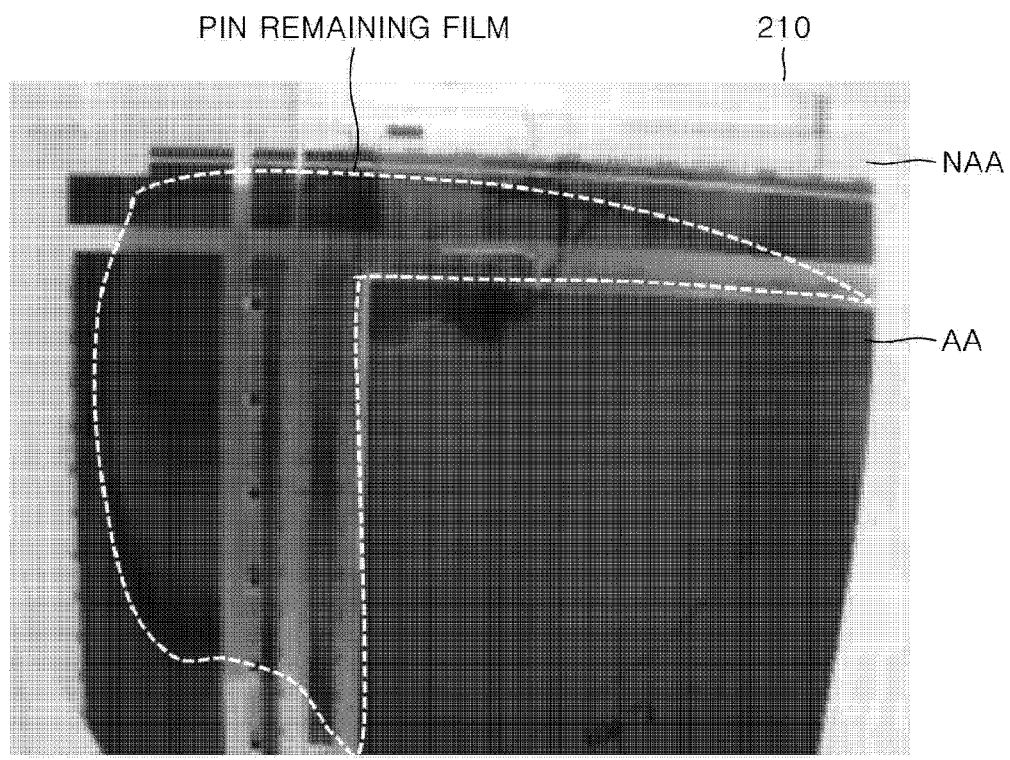
FIG. 6 shows a PIN (P type semiconductor-Intrinsic type semiconductor-N type semiconductor) remaining film according to one embodiment.

The PIN remaining film is an unintended residue of the PIN film 232" and may be mainly disposed in a non-driving area NAA of the substrate other than a driving area AA as shown in FIG. 6.

Figure 7A:
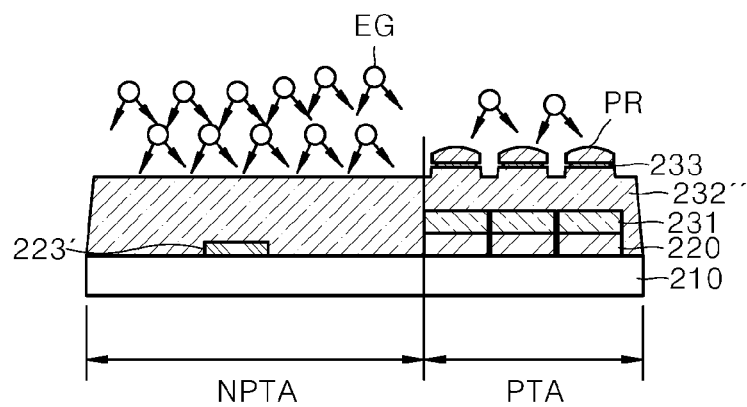
FIGS. 7A and 7B are process diagrams showing a PIN remaining film that may be formed during a PIN layer formation process according to one embodiment.
Figure 7B:
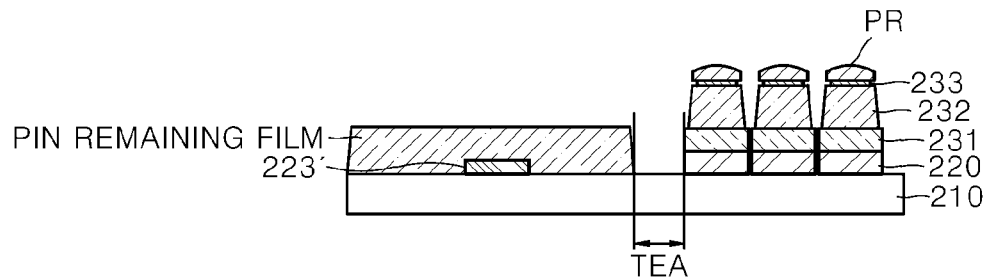

FIGS. 7A and 7B show process diagrams showing a PIN remaining film formed in an align mark AM during PIN layer formation.

In a base substrate 210, at least one driving thin film transistor 220 and a lower electrode 231 may be formed in a pixel P in a driving area AA and a first align mark layer 223' may be formed in an align mark AM in a non-driving area NAA.

A PIN film 232" covers each of the lower electrode 231 and the first align mark layer 223' and an upper electrode 233 and a photo resist PR may each be formed in the pixel P in the driving area AA.

For example, a mask such as a photo resist (PR) is disposed in the driving area AA, and thus, the driving area corresponds to the patterning area PTA, and the PIN film 232" in the align mark AM in the non-patterning area NPTA is preferably removed completely.

Therefore, as shown in FIG. 7A, a large amount of dry etching gas EG is needed compared to the patterning area PTA to completely remove the PIN film 232" in the non-patterning area NPTA.

In particular, as the PIN film 232" has a thick thickness of 1 to 2 µm, a large amount of dry etching gas EG is needed to completely remove the PIN film 232" from the non-patterning area NPTA.

For example, a method of increasing an activation time period of the dry etching gas EG may be used as a method of completely removing the PIN film 232", but in this case, other metal layers in which the etching is not intended, as well as the PIN film 232", may be etched, which results in defects.

Therefore, the density of the etching gas in a specific region, not the activation time period of the etching gas, is preferably controlled to remove the PIN film 232" while reducing the etching of other metal layers.

As shown in FIG. 7B, as an align mark AM in a non-patterning region NPTA is disposed within a vulnerable area of the etching gas, the PIN film 232" is not completely etched and a PIN remaining film remains.

For example, as the PIN remaining film is formed on a first align mark layer 223' in an align mark AM, a defect may occur because the first align mark layer 223' is not properly recognized.

Figure 8A:
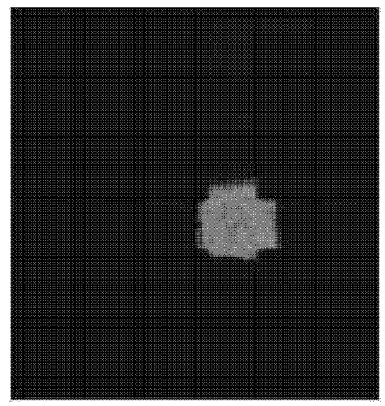
FIG. 8A shows an area of an align mark covered by a PIN remaining film according to one embodiment.

FIG. 8A shows a PIN remaining film formed on a portion of an area on an align mark layer and that the align mark layer is not properly recognized by the PIN remaining film.

Figure 8B:
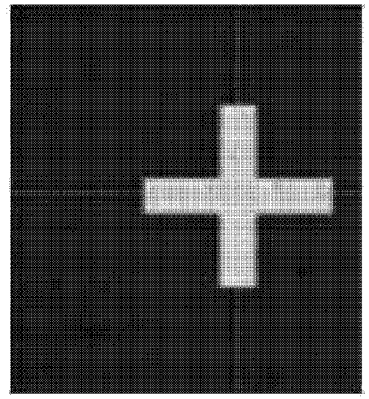
FIG. 8B shows an align mark not covered by a PIN remaining film according to one embodiment.

FIG. 8B shows a PIN remaining film completely removed from an align mark layer and that a cross shape of the align mark layer is clearly recognized.

Referring to FIG. 7B, some area of a boundary portion between the patterning area PTA and the non-patterning area NPTA may be "a fully etched area TEA", where the etching is completely performed and the PIN film 232" is removed.

The fully etched area TEA is an area where etching gases that do not react in the patterning area PTA in which a small amount of etching gas reacts are concentrated on the boundary between the patterning area PTA and the non-patterning area NPTA and the PIN remaining film may be completely removed from the fully etched area TEA.

According to the present disclosure, processes may be performed as follows to minimize a phenomenon in which the align mark layer of the align mark AM in the non-patterning area NPTA is covered by the PIN remaining film and is not recognized.

FIG. 9A to 9F are process diagrams showing an example method of manufacturing a thin film transistor array substrate for a digital X-ray detector device.

Figure 9A:
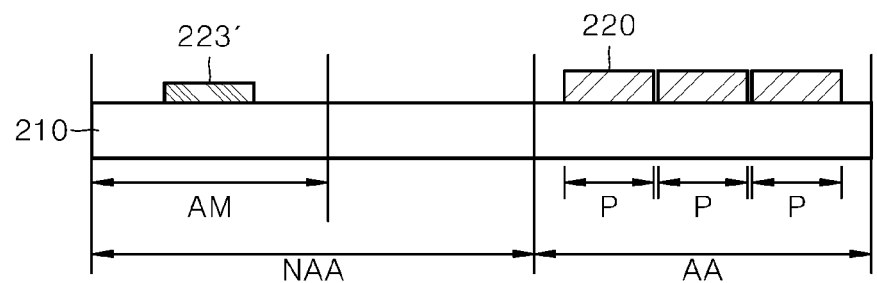
FIG. 9A to 9F are process diagrams showing example methods for manufacturing a thin film transistor array substrate for a digital X-ray detector device according to one embodiment.

As shown in FIG. 9A, a driving thin film transistor 220 including an active layer 221, a first electrode 225a, a second electrode 225b, and a gate electrode 223a are formed in each of one or more pixels P in a driving area AA of a base substrate 210. A first align mark layer 223' is formed in at least one align mark AM in a non-driving area NAA.

In this case, the gate electrode 223a and the first align mark layer 223' are formed by the same patterning process.

Figure 9B:
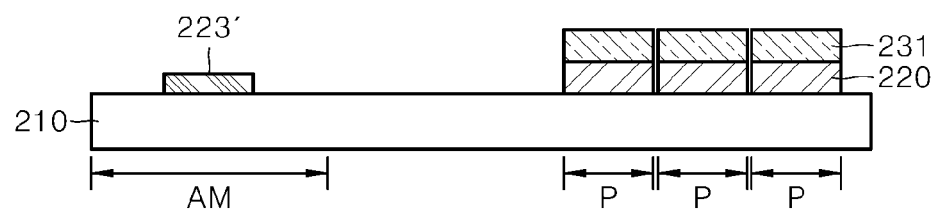

As shown in FIG. 9B, a lower electrode 231 is formed on each driving thin film transistor 220 in a pixel P.

Figure 9C:
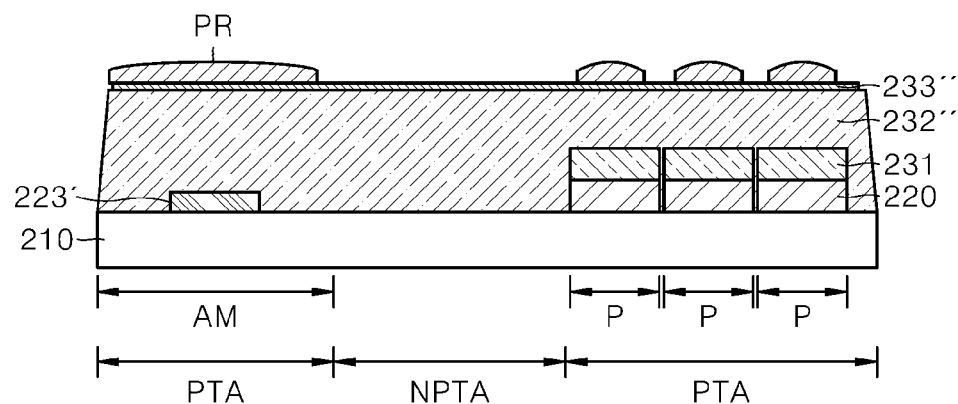

As shown in FIG. 9C, a PIN film 232" is formed on a whole surface of a base substrate 210 and an upper electrode film 233" is formed on the PIN film 232" to cover a first align mark layer 223' of an align mark AM and a lower electrode 231 of a pixel P.

A photo resist PR is formed on the upper electrode film 233" to be disposed in each of the align mark AM and the pixel P.

As the photo resist PR formed as described above functions as a mask in the patterning process, an area where the photo resist PR is disposed is a patterning area PTA and an area where no photo resist PR is disposed is a non-patterning area NPTA.

Figure 9D:
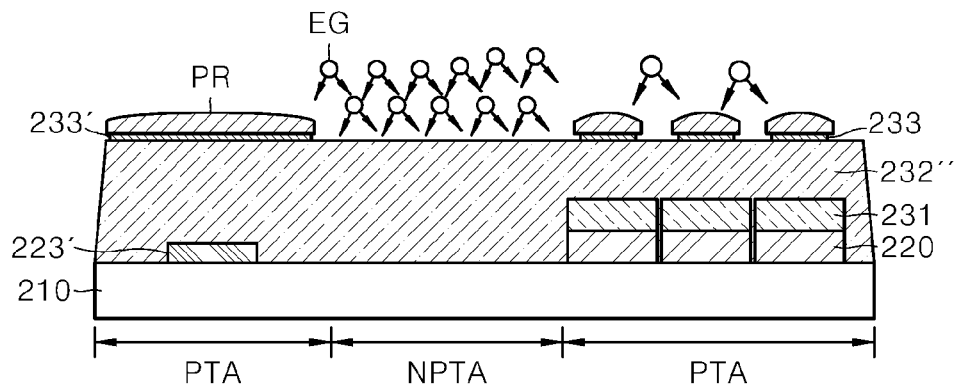

As shown in FIG. 9D, an upper electrode layer 233" is etched using a mask to form an align upper electrode film 233' in an align mark AM and to form an upper electrode 233 in a pixel P. A wet etching method may be used with etching liquid to etch the upper electrode film 233", but is not limited thereto.

After etching the upper electrode film 233", the PIN film 232" is patterned using a dry etching gas EG as shown in FIG. 9D.

Figure 9E:
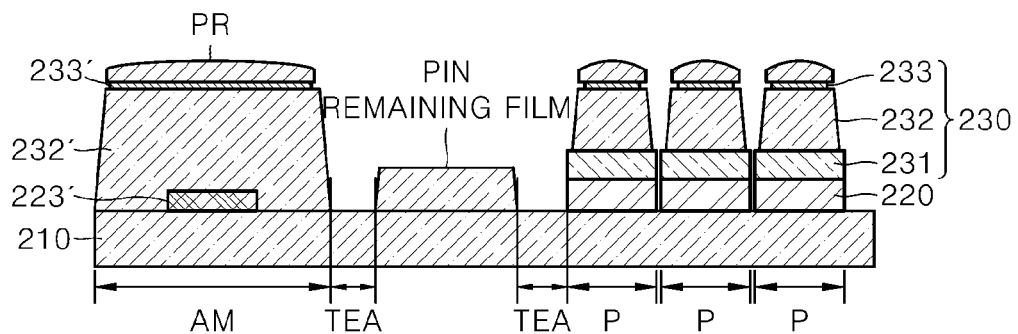

An align PIN layer 232' is formed in an align mark AM and a PIN layer 232 is formed in a pixel P as shown in FIG. 9E by patterning a PIN film 232" using the dry etching gas EG. For example, the PIN layer 232 and the align PIN layer 232' are formed by the same patterning process.

In this case, the align mark AM corresponds to the patterning area PTA in which a photo resist PR is formed and a PIN remaining film is not disposed and an additional align PIN layer 232' may be formed.

In some examples, the PIN remaining film may be formed within some area of the remaining area of the base substrate 210 except for the align mark AM and the pixels P, that is, the non-patterning area NPTA and an area between the align mark AM and the PIN remaining film and an area between the pixel P and the PIN remaining film each are fully etched areas TEA and boundaries of the PIN remaining film may be clearly determined.

In particular, as the align mark AM also becomes the patterning area PTA, dry etching gases EG that do not react in the align mark AM react at a boundary area between the align mark AM and the PIN remaining film, and thus, the boundary area between the align mark AM and the PIN remaining film may be the fully etched area TEA to minimize an influence of the PIN remaining film on the align mark AM.

Figure 9F:
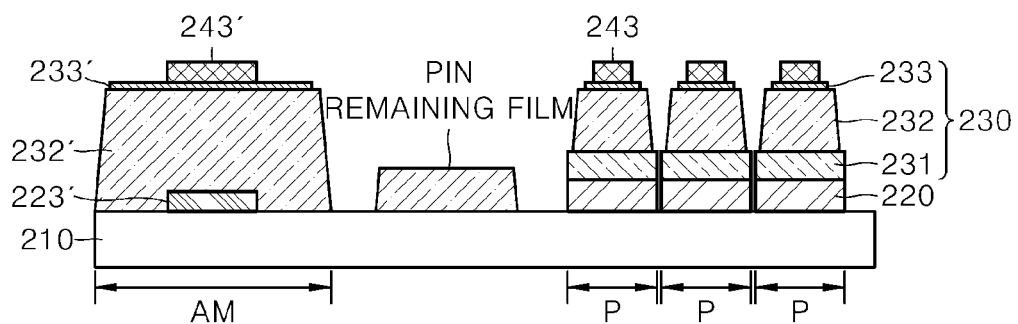

As shown in FIG. 9F, the photo resist PR in the align mark AM and the pixels P are removed, a second align mark layer 243' is formed on the align upper electrode layer 233', and a bias electrode 243 is formed on an upper electrode 233.

In this case, the bias electrode 243 and the second align mark layer 243' are formed by the same patterning process.

The alignment may be adjusted using the first align mark layer 223' before the align PIN layer 232' is formed and the alignment may be adjusted using a second align mark layer 243' after the align PIN layer 232' is formed by forming the second align mark layer 243' above the align PIN layer 232' of the align mark AM.

For example, according to the present disclosure, the align PIN layer is formed above the first align mark layer through the same patterning process as the patterning process using the photo resist to form the PIN layer in the pixel. The formation of an unintended PIN remaining film may be minimized in the align mark through the patterning process.

In addition, according to the present disclosure, the align PIN layer is formed on the first align mark layer and then the second align mark layer is further formed to use the second align mark layer as an align mark after the PIN layer is formed, thereby reducing incorrect recognition of the align mark even after the PIN layer is formed.

According to the present disclosure, in order to reduce the incorrect alignment of the digital X-ray detector device, the incorrect recognition of the align mark by the PIN remaining film may be reduced, thereby obtaining high-quality images and improving a yield of the digital X-ray detector panel.

According to the present disclosure, the thin film transistor array substrate for the digital X-ray detector device and the digital X-ray detector device include a base substrate including a driving area and a non-driving area, at least one PIN diode disposed in the driving area of the base substrate and including a lower electrode, a PIN layer, and an upper electrode, and at least one align mark disposed in the non-driving area of the base substrate and the align mark includes a first align mark layer, an align PIN layer, and a second align mark layer.

In this case, the first align mark layer, the align PIN layer, and the second align mark layer may be sequentially stacked on the base substrate.

The non-driving area may surround the driving area and the align mark may be disposed at one or more corners of the non-driving area.

The driving area of the base substrate includes an active layer, a first electrode, a second electrode, a gate electrode, and a driving thin film transistor connected to a PIN diode, and the first align mark layer may be made of the same material as the gate electrode.

In addition, the PIN layer may be made of the same material as the align PIN layer, a bias electrode is disposed above the PIN layer, and the second align mark layer may be made of the same material as the bias electrode.

The align electrode layer is disposed between the align PIN layer and the second align mark layer and the align upper electrode layer may be made of the same material as the upper electrode.

The bias electrode is disposed above the PIN layer and the second align mark layer may be made of the same material as the bias electrode.

In addition, according to an embodiment of the present disclosure, a method for manufacturing a thin film transistor array substrate for a digital X-ray detector device includes i) forming a driving thin film transistor including an active layer, a first electrode, a second electrode, and a gate electrode in at least one pixel in a driving area of a base substrate and disposing a first align mark layer in at least one align mark in a non-driving area of the base substrate, ii) forming a lower electrode on the driving thin film transistor, iii) forming a PIN film above a whole surface of the base substrate and forming an upper electrode film on the PIN layer, iv) forming a photo resist corresponding to the align mark and the pixel on the upper electrode film, v) forming the align PIN layer and the align upper electrode in the align mark and forming the PIN diode including the lower electrode, the PIN layer, and the upper electrode in the pixel by patterning the upper electrode film and the PIN film, and vi) forming the second align mark layer on the align upper electrode and forming the bias electrode on the upper electrode.

In this case, the gate electrode and the first align mark layer may be formed by the same patterning process, the PIN layer and the align PIN layer may be formed by the same patterning process, and the bias electrode and the second align mark layer may be formed by the same patterning process.

The PIN film may also be patterned with the dry etching gas.

Although the present disclosure has been described with reference to the exemplary drawings, the present disclosure is not limited to the embodiments and the drawings disclosed herein, and various modifications can be made by those skilled in the art within the scope of the technical idea of the present disclosure. Further, even if working effects obtained based on configurations of the present disclosure are not explicitly described in the description of embodiments of the present disclosure, effects predictable based on the corresponding configuration have to be recognized.

What is claimed is:

1. A thin film transistor array substrate for a digital X-ray detector device, comprising:
   a base substrate comprising a driving area and a non-driving area;
   at least one P type semiconductor-Intrinsic type semiconductor-N type semiconductor (PIN) diode disposed within the driving area of the base substrate including pixel regions and comprising a lower electrode, a PIN layer, and an upper electrode; and
   at least one align mark disposed within the non-driving area of the base substrate,
   wherein the at least one align mark comprises a first align mark layer, an align PIN layer, and a second align mark layer,
   wherein a fully etched area from which the PIN layer is removed is disposed between the pixel regions and the at least one align mark.

2. The thin film transistor array substrate for the digital X-ray detector device of claim 1, wherein the first align mark layer, the align PIN layer, and the second align mark layer are sequentially stacked on the base substrate.

3. The thin film transistor array substrate for the digital X-ray detector device of claim 2, wherein an active layer, a first electrode, a second electrode, a gate electrode, and a driving thin film transistor connected to the PIN diode are disposed in the driving area of the base substrate; and
   wherein the first align mark layer is made of a same material as the gate electrode.

4. The thin film transistor array substrate for the digital X-ray detector device of claim 2, wherein the PIN layer is made of a same material as the align PIN layer.

5. The thin film transistor array substrate for the digital X-ray detector device of claim 2, wherein an align upper electrode layer is disposed between the align PIN layer and the second align mark layer; and
   wherein the align upper electrode layer is made of a same material as the upper electrode.

6. The thin film transistor array substrate for the digital X-ray detector device of claim 2, wherein a bias electrode is disposed on the PIN layer; and
   wherein the second align mark layer is made of a same material as the bias electrode.

7. The thin film transistor array substrate for the digital X-ray detector device of claim 1, wherein the non-driving area is configured to surround the driving area; and wherein the at least one align mark is disposed in at least one corner of the non-driving area.

8. A digital X-ray detector device, comprising:
a base substrate comprising a driving area and a non-driving area;
at least one P type semiconductor-Intrinsic type semiconductor-N type semiconductor (PIN) diode disposed within the driving area of the base substrate including pixel regions and comprising a lower electrode, a PIN layer, and an upper electrode; and
at least one align mark disposed within the non-driving area of the base substrate,
wherein the at least one align mark comprises a first align mark layer, an align PIN layer, and a second align mark layer, and
a scintillator layer disposed above the PIN diode,
wherein the align PIN layer is spaced apart from the PIN layer and has an island shape such that the align PIN layer is not electrically connected to the PIN layer.

9. A method for manufacturing a thin film transistor array substrate for a digital X-ray detector device, comprising:
forming a driving thin film transistor in at least one pixel disposed within a driving area of a base substrate, the driving thin film transistor comprising an active layer, a first electrode, a second electrode, and a gate electrode;
forming a first align mark layer in at least one align mark disposed within a non-driving area;
forming a lower electrode on the driving thin film transistor;
forming a P type semiconductor-Intrinsic type semiconductor-N type semiconductor (PIN) film above a whole surface of the base substrate;
forming an upper electrode layer on the PIN film;
forming a photo resist on the upper electrode film to correspond to each of the at least one align mark and the at least one pixel;
forming an align PIN film and an align upper electrode layer in the align mark;
forming a PIN diode comprising the lower electrode, a PIN layer, and an upper electrode in the pixel by patterning the upper electrode film, and patterning the PIN film with dry etching gas;
forming a second align mark layer above the align upper electrode layer; and
forming a bias electrode above the upper electrode wherein the dry etching gas forms a fully etched area in which the PIN layer is removed from a portion between the at least one align mark and the PIN diode.

10. The method for manufacturing the thin film transistor array substrate for the digital X-ray detector device of claim 9, further comprising:
forming the gate electrode and the first align mark layer by a same patterning process.

11. The method for manufacturing the thin film transistor array substrate for the digital X-ray detector device of claim 9, further comprising:
forming the PIN layer and the align PIN layer by a same patterning process.

12. The method for manufacturing the thin film transistor array substrate for the digital X-ray detector device of claim 9, further comprising:
forming the bias electrode and the second align mark layer by a same patterning process.

* * * * *